United States Patent [19]
MacRae et al.
[11] 3,769,109
[45] Oct. 30, 1973

[54] PRODUCTION OF $SIO_2$ TAPERED FILMS

[75] Inventors: Alfred Urquhart MacRae, Berkeley Heights; Robert Alan Moline, Gillette, both of N.J.
[73] Assignee: Bell Telephone Laboratories, Incorporated, Murray Hill, N.J.

[22] Filed: Apr. 19, 1972
[21] Appl. No.: 245,503

[52] U.S. Cl. .......... 156/3, 156/8, 156/17
[51] Int. Cl. .......... H01l 7/50
[58] Field of Search .......... 156/3, 8, 16, 17; 317/234, 235; 148/187; 29/571, 576

[56] References Cited

UNITED STATES PATENTS

| | | | |
|---|---|---|---|
| 3,483,108 | 12/1969 | Schaefer | 156/17 X |
| 3,560,280 | 2/1971 | Nishida | 156/17 |
| 3,713,922 | 1/1973 | Lepselter et al. | 156/17 X |

*Primary Examiner*—William A. Powell
*Attorney*—W. L. Keefauver

[57] ABSTRACT

During $SiO_2$ etching, when the oxide surface etch rate is larger than the bulk etch rate and the photoresist adheres tenaciously to the surface, a near vertical wall or cusp will be formed. This will create potential fracture spots in sputtered or evaporated metal which covers the steps. In the fabrication of self-aligned gate IG-FETs, where the gate material acts as a mask against either etching or ion implantation, holes in the step metal will allow regions under the nominal gate to be doped during the source-drain doping.

The slope of an etched step can be controlled by fabricating a double layer in which the top layer etches faster than the bulk. The specification describes the use of the enhanced etch rate of ion bombarded $SiO_2$ to generate controlled tapers on window openings.

8 Claims, 13 Drawing Figures

PRODUCTION OF $SiO_2$ TAPERED FILMS

This invention relates to processing techniques for the manufacture of semiconductor devices. These are based upon the enhanced chemical etch rates obtainable in silicon dioxide films by exposure to accelerated ions. Selective or preferential etching based upon this discovery can be used in a variety of ways.

For example, there exists in the semiconductor processing art a need for a convenient, reliable and inexpensive method for producing tapered insulating films. Such films are useful for several purposes. A masking layer in which the sides of the window are tapered is capable of producing tuck-under of a junction formed by implantation through it. Tapered films are also useful in multilayer structures for avoiding sharp corners under metallized circuit patterns. In conventional processing, the latter are likely sites for defects.

Tapered films are produced according to this aspect of the invention by exposing the surface of a silicon dioxide film to a penetrating ion beam in the area at which the taper is desired. The etch rate of the exposed region will then exceed the normal etch rate of $SiO_2$. With this precondition, etching proceeds normally through the damaged material, but when the undamaged material is reached, the lateral etch rate along the surface layer exceeds the etch rate in the thickness dimension. An enchanced taper results at the boundary.

These and other aspects of the invention are more fully explained as follows. In the drawing.

FIGS. 1A to 1F show schematically typical sequential steps in the preparation of a tapered film in silicon dioxide according to one aspect of the invention. The substrate 10 is a semiconductor such as silicon (or other material of interest, such as GaAs or GaP) upon which a tapered window is to be formed. The insulating $SiO_2$ layer, shown at 11, may be any thickness consistent with the intended purpose.

Figure 1A:
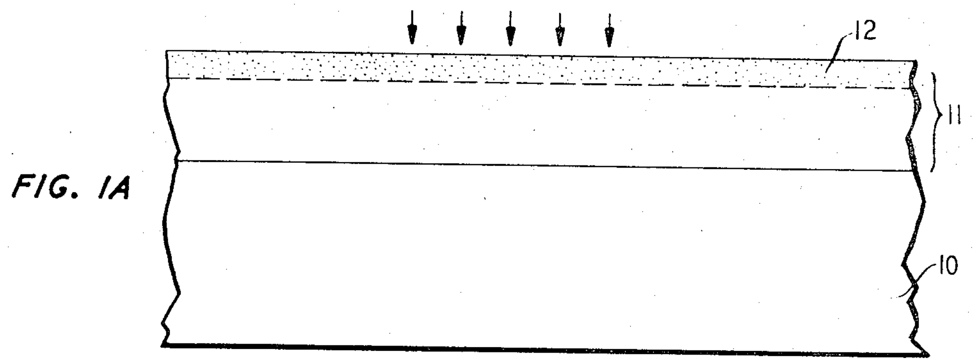
FIGS. 1A to 1F are schematic views illustrating successive steps in a process based on selective etching of silicon dioxide in accordance with one aspect of the invention.
Figure 1B:
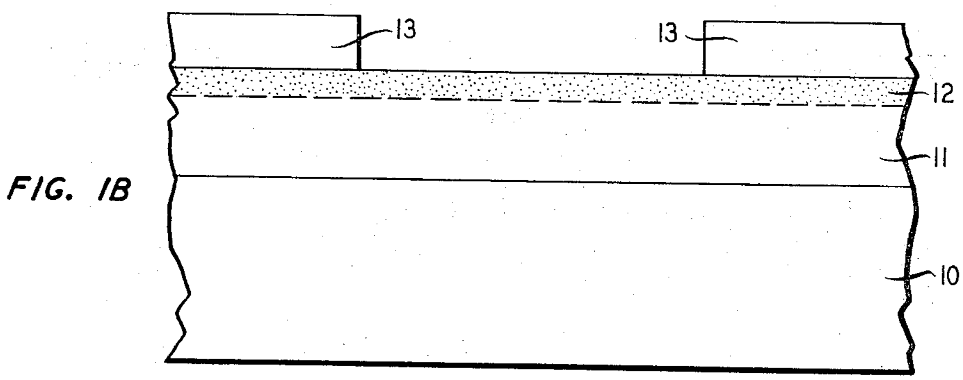

As indicated in FIG. 1A, the silicon dioxide layer 11 is initially exposed to a penetrating ion beam which is chosen to penetrate only partially into the layer. The exposed surface portion is shown at 12 with the boundary between the damaged material and the unexposed silicon dioxide represented by the dashed line. The peak depth of implantation in the sequence shown is less then 1/10 of the thickness of the layer. Assuming by way of example that the layer has a thickness of the order of 0.7 microns, the layer 11 can be exposed to 50 keV $Ar^+$ ions at a dose of $3\times10^{13}$ $cm^{-2}$. (The mean penetration depth at this energy is approximately 500 angstroms.) The ion implanted layer is then masked as shown in FIG. 1B with a standard photolithographic etch mask 13. The mask is formed so that its edges correspond to those regions of the silicon layer that are to be tapered. The region exposed by the mask 13 in FIG. 1B may, for example, represent a window useful with the embodiments described in connection with FIGS. 2A, 2B and 3A, 3B.

The etching behavior of the structure of FIG. 1B is shown at sequential stages in FIGS. 1C to 1F. When the ion damaged material 12 is exposed to a standard buffered HF etch it is found to etch at a rate approximately 2 times the rate of the unexposed material. The tapered window finally obtained appears in FIG. 1F.

Boron, silicon and phosphorous implantations have been found to produce a similar effect on the etching behavior of $SiO_2$. This indicates that the result is attributable to the exposure of the amorphous material to high energy bombardment rather than to chemical doping. Based on this premise, the particular ion used is not critical to the result.

Under normal conditions, i.e., in etching a homogeneous layer, the side walls of the window will show in theory, a slope of the order of 45 degrees. However, as the etching proceeds and the undamaged material is exposed, the rate of lateral etching along the dashed line of FIG. 1C will be nearly twice the rate in the direction of the thickness of layer 11.

Figure 1C:
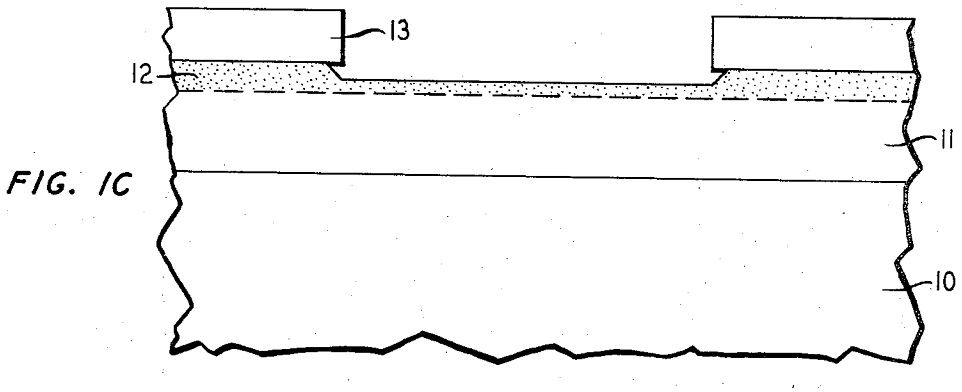
Figure 1D:
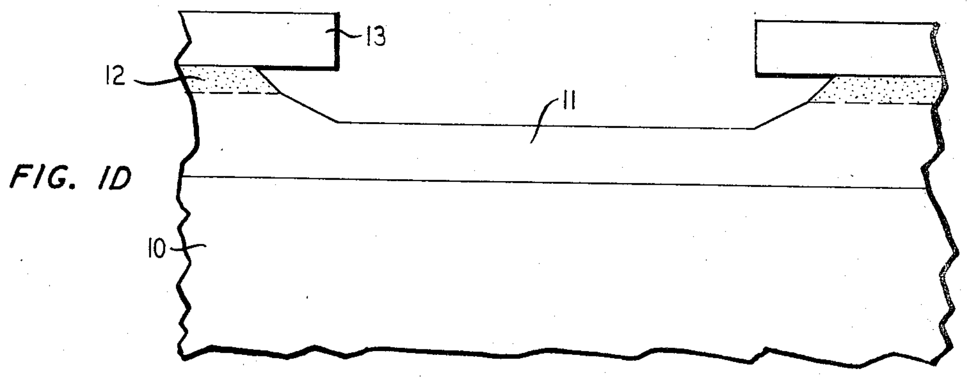
Figure 1E:
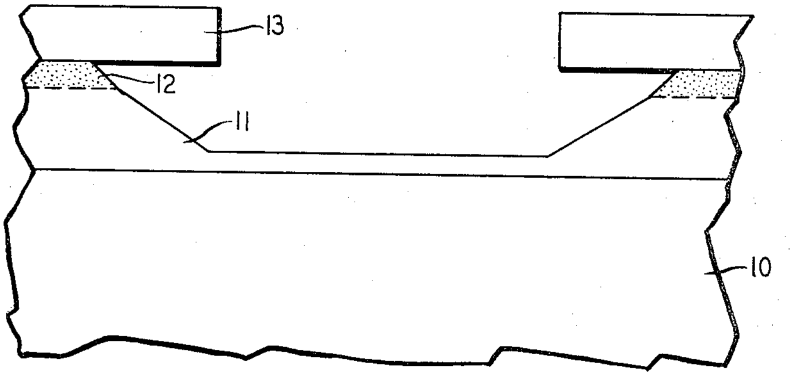
Figure 1F:
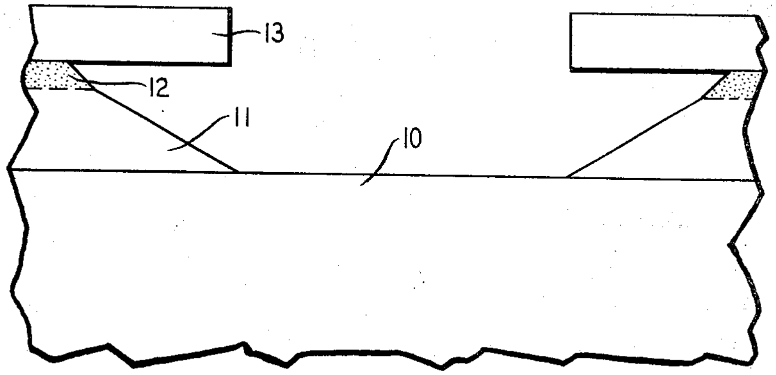

Several aspects of this etching sequence are evident from inspection of the sequence of FIGS. 1C–1E. For example, the slope of the sidewalls of the window through the undamaged material as a consequence of the controlled undercutting is almost 60 degrees to the normal. Also, the effectiveness of this technique is dependent on the thickness of the damaged surface layer. For example, if the layer is exposed through most of its thickness, the predominant portion of the sidewall will slope 45° On the other hand, if just a shallow surface portion is exposed, just enough to facilitate undercutting, then the entire sidewall will approach 60°. For most applications where gradual tapers are desirable it is preferred that the depth of peak ion damage be near the surface. Thus, in the preferred form of the invention, the average ion penetration depth should be less than 1/3 of the thickness of the oxide layer. This discussion and the schematic representations of FIGS. 1C–1F are idealized for clarity but are qualitatively illustrative.

There are other variables that should be considered in adapting this preferential etch technique for a particular application. For example, the preferential etch rate is dependent on the ion exposure and can be tailored within limits to give a desired preferential etch rate. While any significant dose will give some effect, for the purpose of defining the useful scope of this invention it is preferred that the ion dose over at least part of the region to be etched be sufficient to produce at least a 50 percent increase in the etch rate over that of the unimplanted material, as measured with any useful etchant.

In practice, the boundary between the damaged and undamaged material as represented by the dashed line in the figures will not be nearly that sharp over the distances described. An exposure gradient in the direction of the thickness of the layer will give a curved or dish-shaped sidewall.

Figure 2A:
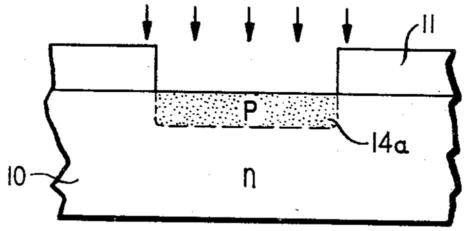
FIG. 2A (PRIOR ART)
FIGS. 2A and 2B are schematic representations of one exemplary application of structures produced in accordance with the process described by FIGS. 1A to 1F.
Figure 2B:
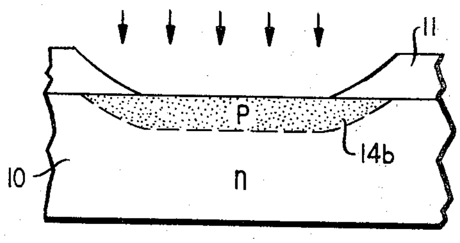

Insulating layers with tapered portions are useful in a variety of ways, two of which are given by way of example in FIGS. 2A, 2B and 3A, 3B. FIG. 2A illustrates schematically the formation of a p-n junction by the known technique of implanting through a window in the masking layer 11'. The prior art window is shown as vertical for purposes of comparison. The implanted region, in this example a p-region, follows the boundaries of the window closely, so that the junction 14*a* intersects the surface at or near the exposed surface of the semiconductor substrate. It is known that this is undesirable due to the abundance of surface states in that region. However, referring to FIG. 2B, if the masking layer 11 is formed so that the edges of the window are well tapered, as by the technique of this invention, then the implanted p-region will form a junction 14*b* that intersects the semicondutor surface well beneath the passivating oxide layer 11. Such a structure has recognized advantages.

The details of the implantation process to form the junctions 14a and 14b are within the skill of the art. As an exemplary procedure, the implantation procedure described in connection with FIG. 1A is appropriate.

Figure 3A:
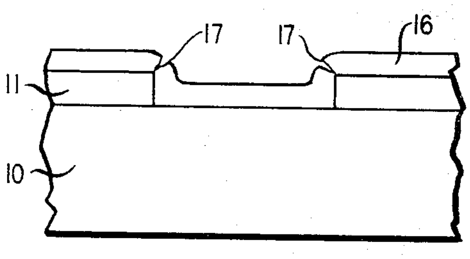
FIGS. 3A and 3B are similar representations of another application for which said structures may be adapted.
Figure 3B:
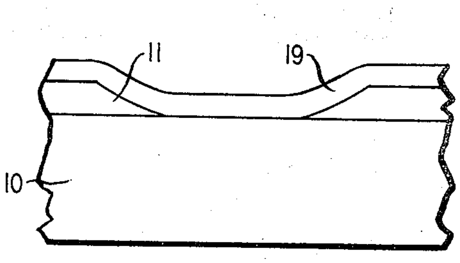

The use of tapered films to avoid sharp corners in multilayer structures is illustrated in FIGS. 3A and 3B. Referring to FIG. 3A, the use of a prior art insulator with windows formed by conventional etch procedures (again the steep sidewalls are exaggerated) may cause a metal layer 16, formed over the edges of the window to crack at positions denoted 17. These are sites of high stress and high current density, both of which commonly contribute to failures in the metalization of semiconductor devices and, in particular, of integrated circuits.

In contrast, a more gradual slope to the sidewall of the window, evident in FIG. 3B, has obvious advantages. The metalized pattern 19 also presents a smoother surface upon which to construct additional layers for second level metalization.

Figure 4A:
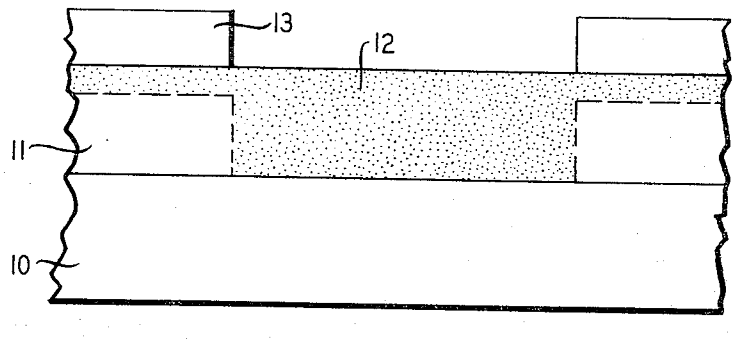
FIGS. 4A to 4C are schematic representations of an alternative processing sequence for producing structures especially useful for the application discussed in connection with FIGS. 3A and 3B.
Figure 4B:
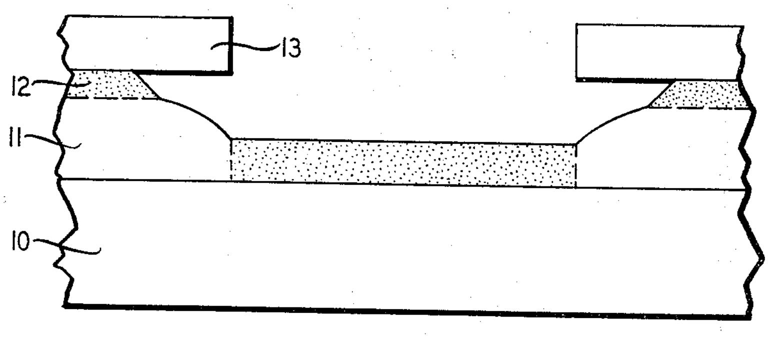
Figure 4C:
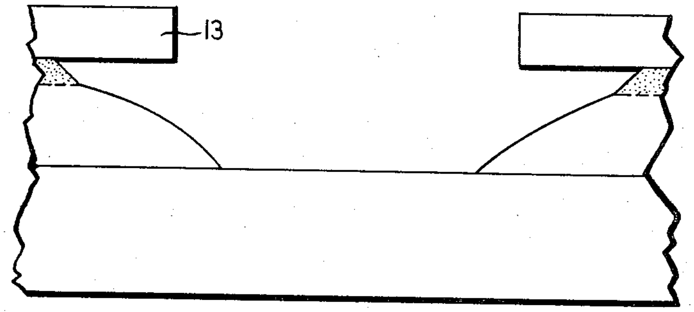

Referring again to FIG. 3B, it would appear that for this application, it would be desirable if the edge of the window were rounded. As an example of the versatility of the invention in providing a means to tailor the taper profile, a rounded window is obtained conveniently by simply exposing the structure of FIG. 1B to a treatment similar to that described in connection with FIG. 1A. In this procedure it is advantageous to use an ion beam that penetrates through the layer 11. The resultant implanted structure is shown in FIG. 4A. Referring to FIG. 4B, as etching proceeds, the corner of the window becomes rounded, with the final structure shown in FIG. 4C. It will be noted that this optional structure is obtainable without the necessity of additional masking.

It is useful to recognize that the etch behavior on which this invention is based is truly anisotropic as contrasted with the various prior art preferential etches for crystal materials that are crystallographically dependent. This property allows three-dimensional freedom so that windows of any geometry can be formed in a $SiO_2$ layer.

The discovery of the preferential etch behavior of silicon dioxide, which forms the basis for this invention, and its use for forming tapered insulating films, has been shown herein to be a useful processing tool. Other uses for this effect may occur to those skilled in the art, but all techniques based upon the teachings through which this invention has advanced the art, are properly considered to be within the scope of this invention.

What is claimed is:

1. A method for producing a tapered silicon dioxide layer on a supporting substrate comprising the steps of,
depositing a silicon dioxide layer on the supporting substrate,
exposing the silicon dioxide layer to an ion beam to penetrate a surface portion of the thickness of the layer, the exposure having an ion dose sufficient to cause the etch rate of the implanted region to exceed the normal rate by at least 50 percent,
masking the silicon dioxide layer so that the edge of the open portion of the mask corresponds to the region of the layer desired to be tapered, and
etching the silicon dioxide layer to produce a tapered layer.

2. The method of claim 1 in which the substrate is silicon.

3. The method of claim 1 in which the ion beam exposure results in a peak ion penetration at a point less than one third of the distance from the surface of the silicon dioxide layer.

4. The method of claim 1 in which the silicon dioxide layer is etched with HF.

5. The method of claim 2 in which the silicon dioxide layer has a thickness of the order of 0.7 microns and is exposed to 50 keV $Ar^+$ions at a dose of approximately $3 \times 10^{13}$ $cm^{-2}$.

6. The method of claim 1 in which the ion beam contains ions selected from the group consisting of boron, phosphorus, argon and silicon.

7. A method for obtaining a tapered silicon dioxide layer on a supporting substrate comprising the steps of,
depositing a silicon dioxide layer on the supporting substrate,
exposing the silicon dioxide layer to an ion beam to penetrate a surface portion of the thickness of the layer,
masking the silicon layer so that the edge of the open portion of the mask corresponds to the region of the layer desired to be tapered,
exposing the unmasked portion of the silicon dioxide layer to an ion beam to penetrate through that region of the silicon dioxide layer,
the ion beam exposure in each case having an ion dose sufficient to cause the etch rate of the implanted regions to exceed the normal etch rate by at least 50 percent,
and etching the silicon dioxide layer to produce a typered layer.

8. The method of claim 7 in which the silicon layer is masked with a shadow mask and the entire surface of the silicon dioxide layer is subsequently at least partly etched.

* * * * *